(12) United States Patent
Naidu et al.

(10) Patent No.: US 11,630,145 B2
(45) Date of Patent: Apr. 18, 2023

(54) INTELLIGENT ELECTRONIC DEVICE OPERATION DURING POWER SWING

(71) Applicant: Hitachi Energy Switzerland AG, Baden (CH)

(72) Inventors: Obbalareddi Demudu Naidu, Karnataka (IN); Preetham Venkat Yalla, Karnataka (IN); Vedanta Pradhan, Bhubaneswar (IN); Suresh Maturu, Andhra Pradesh (IN)

(73) Assignee: Hitachi Energy Switzerland AG, Baden (CH)

( * ) Notice: Subject to any disclaimer, the term of this patent is extended or adjusted under 35 U.S.C. 154(b) by 0 days.

(21) Appl. No.: 17/618,708

(22) PCT Filed: Jun. 26, 2020

(86) PCT No.: PCT/EP2020/068103
§ 371 (c)(1),
(2) Date: Dec. 13, 2021

(87) PCT Pub. No.: WO2020/260636
PCT Pub. Date: Dec. 30, 2020

(65) Prior Publication Data
US 2022/0244304 A1 Aug. 4, 2022

(30) Foreign Application Priority Data

Jun. 28, 2019 (IN) .............................. 201941025771
Aug. 14, 2019 (EP) ...................................... 19191785

(51) Int. Cl.
*G01R 31/08* (2020.01)
*G01R 17/02* (2006.01)
(Continued)

(52) U.S. Cl.
CPC ........... *G01R 31/086* (2013.01); *G01R 17/02* (2013.01); *G01R 19/02* (2013.01); *G01R 19/2509* (2013.01); *G01R 19/2513* (2013.01)

(58) Field of Classification Search
CPC ...... G01R 31/086; G01R 17/02; G01R 19/02; G01R 19/2509; G01R 19/2513; G01R 19/04; Y04S 10/52
(Continued)

(56) References Cited

U.S. PATENT DOCUMENTS

2009/0089608 A1 4/2009 Guzman-casillas
2009/0099798 A1 4/2009 Gong et al.
(Continued)

FOREIGN PATENT DOCUMENTS

EP 2490031 A1 8/2012
WO 2009/042966 A1 4/2009

OTHER PUBLICATIONS

International Search Report and Written Opinion for the corresponding PCT Application No. PCT/EP2020/068103, dated Aug. 25, 2020, 14 pages.
(Continued)

*Primary Examiner* — Farhana A Hoque
(74) *Attorney, Agent, or Firm* — Procopio Cory Hargreaves and Savitch LLP

(57) ABSTRACT

Examples of operating an Intelligent Electronic Device (IED) during power swings, are described. In an example, voltage measurements for a phase is received and sampled. Root mean square (RMS) values of the voltage samples is calculated based on the voltage measurements. Delta quantities for each phase are calculated based on the RMS values. Each of the RMS values and delta quantities are associated with respective sampling instants. In response to a delta quantity being greater than a predefined threshold, a peak (Continued)

delta quantity is detected. A time interval between a sampling instant associated with the peak delta quantity and a sampling instant associated with a first delta quantity is determined. Based on a comparison of the time interval with a threshold time, a disturbance condition may be detected as a power swing and consequently, fault detection at the IED may be blocked.

20 Claims, 8 Drawing Sheets

(51) Int. Cl.
 *G01R 19/02* (2006.01)
 *G01R 19/25* (2006.01)
(58) Field of Classification Search
 USPC ....................................................... 324/500
 See application file for complete search history.

(56) References Cited

U.S. PATENT DOCUMENTS

2018/0275199 A1\* 9/2018 Parkin ................ G01R 19/2513
2019/0237966 A1 8/2019 Porter

OTHER PUBLICATIONS

Mohanty et al., "A Novel wavelet Technique for fault detection in Transmission line during Power Swing", 2018 IEEE International Conference on Power Electronics, Drives and Energy Systems (PEDES), IEEE, Dec. 18, 2018, pp. 1-6, DOI: 10.1109/PEDES.2018.8707462.

Kumar et al., "Synchrophasor-based system integrity protection scheme for an ultra-mega-power project in India", IET Generation, Transmission & Distribution, IET, UK, vol. 13, No. 8, Apr. 23, 2019, pp. 1220-1228, XP006080794, ISSN: 1751-8687, DOI: 10.1049/IET-GTD.2018.5510.

\* cited by examiner

INTELLIGENT ELECTRONIC DEVICE OPERATION DURING POWER SWING

CROSS-REFERENCE TO RELATED APPLICATIONS

The present application is a national stage entry of International App. No. PCT/EP2020/068103, filed on Jun. 26, 2020, which claims priority to Indian App. No. 201941025771, filed on Jun. 28, 2019, and European App. No. 19191785.5, filed on Aug. 14, 2019, which are all hereby incorporated herein by reference as if set forth in full.

TECHNICAL FIELD

The present application relates, in general to power transmission systems. More specifically, the present application relates to operating an Intelligent Electronic Device (IED) in a power swing condition.

BACKGROUND

Power system device(s), such as Impedance-type Distance relays and Intelligent Electronic Devices (IEDs) are used in general for monitoring and protection of transmission lines in electrical networks. Power systems of the electrical networks, generally, operate under steady-state conditions. Under steady-state conditions, power system equipment and transmission lines carry nominal voltages and currents which results in normal operation of the power system and the electrical networks. The steady state of the electrical networks may get effected when electrical disturbances occur in the transmission lines.

Electrical disturbances, such as electrical faults and power swings, may result the power system to deviate from steady-state. These faults may cause interruption to electricity flow, damage to equipment and impose risk to human life. Electrical faults cause a deviation of voltages and currents from nominal values. When fault occurs, it causes excessively high currents to flow which is detrimental to power system equipment and devices. Power swings refer to oscillations in active and reactive power flows on a transmission line. Power swings may occur as a result of power system faults, line switching, generator disconnection, and switching on/off large blocks of load.

BRIEF DESCRIPTION OF DRAWINGS

The following detailed description references the drawings, wherein.

DETAILED DESCRIPTION

Figure 1:
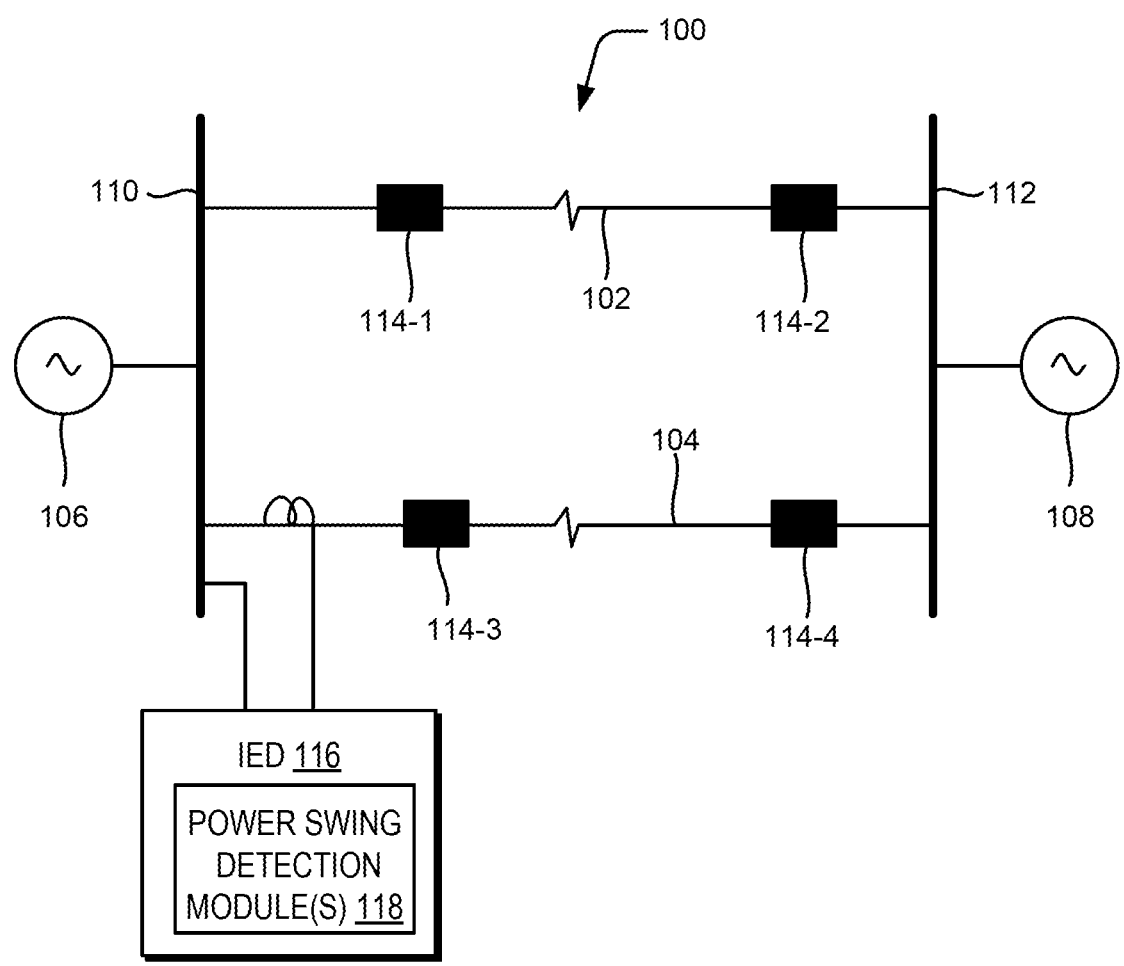
FIG. 1 illustrates a block diagram of a two-source equivalent electrical network, according to an example.

Protective devices, such as distance relays/Intelligent Electronic Devices (IEDs) are designed to provide the primary and backup protection of transmission lines. In steady-state condition of the electrical network, the value of the line voltage remains more than the line current. When a fault occurs, the magnitude of the current rises and the voltage reduces, thereby the line impedance (ratio of line voltage to current) of a faulty section of a transmission line reduces. The distance relay/IED continuously monitors the line current and voltage flows. If the ratio of voltage to current phasor (impedance) falls below a predefined threshold set in the relay/IED, the relay/IED enters into its operating zone and it sends a trip command to a switching component, such as a circuit breaker, to disconnect the circuit thereby protecting components of the power system from damage. This is expected to happen only during normal short-circuit fault condition. However, impedance seen by the relay/IED can enter in to the trip boundary during special cases, such as load encroachment and power swing conditions. The load encroachment can cause an undesirable operation of an impedance relay due to severe loading conditions. There are several methods to prevent mis-operation due to load encroachment such as by changing the shape of impedance characteristic and by implementing load blinder scheme, etc.

Another scenario is the power swing. Power swing is often caused by severe disturbances, such as tripping of the transmission line, loss of generation, and switching of large blocks of load. During a power swing, the apparent impedance of the transmission line may enter within the operating characteristics of the IED, since the maximum amplitude of current and minimum amplitude of voltage may occur simultaneously during the power swing. As a result, even in the absence of a fault, the IED may enter into its operating zone and tend to trip in view of the apparent impedance measured by the IED. Based on this, power swings may be misinterpreted as faults and the IED may trip, leading to cascading line outages.

Power swing blocking functions are included in IEDs to distinguish between a power swing and a fault, and to block the IED from operating during a power swing. Generally, different methods are used to detect a power swing and block the IED during the power swing. Blinder or concentric characteristic based differentiation between faults and power swings may be employed. The concentric characteristic based differentiation involves determining values of several parameters, such as, blinder position and time settings, depending on the line and power system impedances, and swing frequency. Hence, to use blinder-based differentiation, meticulous and detailed fault study and stability study programs are to be performed under various operating scenarios of the power system. Further, with introduction of renewable sources of power, the swing frequencies may tend to reduce which may make a timer-based differentiation between power swing and faults complex and error-prone.

Another method which may be employed for distinguishing power swings and faults may be based on determining Swing Center Voltage (SCV). SCV is the voltage at a point in a two-source equivalent system where voltage magnitude is zero when the angle between two sources is 180 degrees. During power swing, SCV changes continuously but it remains almost constant during fault except for an abrupt change during the initial period after fault. Thus, the rate of change of magnitude of SCV may be used for detecting a power swing and accordingly operating the IED. However, a cause of concern with this method is the setting of a reliable threshold. For example, the threshold shall be kept very low for detecting low frequency (0.2-0.5 Hz) powers swings. Also, it may happen that the change in SCV voltage is not detected in case of a high resistance fault occurring at 180 degrees (faults nearer to swing center point) power angle.

Another method may be based on the decreased resistance and rate of change of resistance to distinguish the power swing and fault. During power swing, the resistance of the measured impedance changes continuously. But when a fault occurs, the resistance of the measured impedance does not change except at the initial instant of fault. The rate of change of resistance significantly reduces during power swing with low slip frequency and consequently this method may fail to distinguish between three phase faults and power swings. Further, super imposed current and voltage signals may be used to detect power swings. However, this technique may fail to detect the high impedance faults that occurs near swing center voltage and with power angle close to 180 degrees, since, under these conditions the super imposed quantities tend to be negligibly small.

The present disclosure relates to operating an Intelligent Electronic Device (IED) in a power swing condition. In an example, the IED is associated with a terminal of a power transmission line in an electrical network of a power system. According to embodiments, the IED can reliably and accurately identify occurrence of a power swing and consequently fault detection at the IED may be blocked during power swing to prevent undesired tripping. Approaches according to embodiments, enable identification of a power swing originating from steady-state conditions independent of the stability study parameters, such as blinder position settings and time settings. Further, the techniques of embodiments are also independent of power system parameters, such as line and system impedances, and swing frequency. Also, the techniques of embodiments enable to distinguish between three-phase faults and power swings.

According to an example of an embodiment, the IED may receive voltage measurements for each phase of the terminal of the power transmission line. In an example, the IED may receive the voltage measurements from a potential transformer (PT). The voltage measurements may be instantaneous voltage readings of the line voltage of the transmission line. The voltage measurements are sampled to obtain a plurality of samples, each of the plurality of samples corresponding to a sampling instant which is a time instant at which a sample is captured. The IED determines a plurality of root mean square (RMS) values for each phase based on the voltage measurements of the corresponding phase. Each of the plurality of RMS values is associated with a respective sampling instant, amongst the plurality of sampling instants. Each of the plurality of RMS values is calculated using a predefined number of samples. The predefined number of samples include the sample captured at the respective sampling instant and samples captured at preceding sampling instants. In an example, the predefined number of samples is dependent on the sampling rate and hardware capabilities of the IED. In an example, the predefined number of samples may be 20 samples or more than 20 samples. The IED determines a plurality of delta quantities of voltage for each phase. The delta quantities of voltage may also be referred to as delta quantities. Each of the plurality of delta quantities is associated with the respective sampling instant. Each of the plurality of delta quantities is a difference between an RMS value associated with the respective sampling instant and an RMS value associated with a sampling instant or preceding the predefined number of samples. Further, it is detected whether a delta quantity, amongst the plurality of delta quantities, is greater than a predefined threshold. The IED detects a peak delta quantity of voltage, in response to determining that the delta quantity is greater than the predefined threshold. A time interval between a sampling instant associated with the peak delta quantity and a sampling instant associated with a first delta quantity is determined. A disturbance condition is detected based on a comparison of the time interval with a threshold time. In response to detecting that the disturbance condition is a power swing, fault detection at the IED is blocked.

Thus, an embodiment enables detection of a power swing by a simpler manner without the use of fault and stability study parameters and power system parameters, as may be required in other blinder or concentric characteristic based differentiation techniques between faults and power swings. Further, with the technique of an embodiment, power swings may also be reliably distinguished from three-phase faults. Consequently, in response to detection of power swing, fault detection at the IED may be blocked thereby preventing undesired tripping of switching components, such as circuit breakers, in the power system. Further, this method may also be implemented in two-phase systems, by monitoring delta quantities of voltage over the two phases.

The following detailed description refers to the accompanying drawings. Wherever possible, the same reference numbers are used in the drawings and the following description to refer to the same or similar parts. While several examples are described in the description, modifications, adaptations, and other implementations are possible. Accordingly, the following detailed description does not limit the disclosed examples. Instead, the proper scope of the disclosed examples may be defined by the appended claims.

FIG. 1 illustrates a block diagram of a two-source equivalent electrical network 100, according to an example. The electrical network 100 comprises a double circuit line comprising transmission lines 102 and 104 and two-electrical sources, namely sources 106 and 108. The electrical network 100 may transmit electric power at high voltages, such as in the range of kilovolts, and for long distances, such as for tens or hundreds of kilometres.

The transmission lines 102 and 104 are connected between two buses 110 and 112. The transmission lines 102, 104 are further provided with one or more circuit breaker(s) 114-1, 114-2, 114-3 and 114-4 (collectively referred to as circuit breaker(s) 114). The circuit breaker(s) 114 allow opening of the circuit to restrict the flow of current in the electrical network 100. The electrical network 100 may include further components without deviating from the scope of the present disclosure.

The electrical network 100 is further installed with an intelligent electronic device (referred to as the IED 116). The IED 116 may be in electrical communication with the transmission lines 102, 104, either directly or through other connecting means. As shown in FIG. 1, the IED 116 is placed at the bus 110 and measures the voltage and current signal of the protected line. Thus, the IED 116 is associated with a terminal of the power transmission line 104. The IED 116, during operation, may receive data from one or more sensors and potential transformers (PT) that may be installed within the electrical network 100. Based on the data received, the IED 116 may generate one or more signals to control the circuit breaker(s) 114.

The IED 116 further includes a disturbance condition detection module 118. The disturbance condition detection module 118 may be implemented as either software installed within the IED 116, or as hardware in the form of electronic circuitry. In an example, the disturbance condition detection module 118 may be coupled with a processor of the IED 116. An embodiment is capable of detecting power swings occurring in the electrical network 100 and may block fault detection at the IED accordingly, thereby preventing unnecessary tripping of the circuit breakers 114.

In operation, the disturbance condition detection module 118 receives voltage measurements for each phase of the terminal of the power transmission line 104. In an example, the voltage measurements may be instantaneous voltage readings of the line voltage of the transmission line, 104 received from a PT in the transmission line. Based on analysis of these voltage measurements for each phase, the IED 116 may detect occurrence of a power swing in the corresponding phase. In an example, in a three-phase power system, a power swing may be detected by executing the method explained hereinafter using voltage measurements for one phase. In another example, the power swing in the transmission line may be detected on detection of power swing in all the phases of a three-phase power system. Although, the description hereinafter is elaborated with reference to one phase, however, the same is applicable mutatis mutandis to all phases of the electrical network 100.

In an example, the IED 116 may sample the voltage measurements based on a predefined sampling rate. In an example, the predefined sampling rate may be 20 samples per cycle. In an example, the IED 116 may perform the sampling at different sampling frequencies ranging from the order of KiloHertz (KHz) to MegaHertz (MHz), depending on the hardware capabilities of the IED 116. Therefore, different number of samples per cycle may be obtained. Thus, a plurality of samples is obtained after sampling by the IED 116. Each of the plurality of samples correspond to a sampling instant which is a time instant at which a sample is captured.

Once the received voltage measurements are sampled, the disturbance condition detection module 118 may determine a plurality of root mean square (RMS) values for each phase based on the voltage measurements of the corresponding phase. Each of the plurality of RMS values is associated with a respective sampling instant, amongst the plurality of sampling instants. Each of the plurality of RMS values is calculated using a predefined number of samples. The predefined number of samples include the sample captured at the respective sampling instant and samples captured at preceding sampling instants. In an example, the predefined number of samples may be 20 samples depending on the sampling rate and configuration of the IED 116.

Once the RMS values for each phase is determined, the disturbance condition detection module 118 determines a plurality of delta quantities for each phase. Each of the plurality of delta quantities is associated with the respective sampling instant, and each of the plurality of delta quantities is a difference between an RMS value associated with the respective sampling instant and an RMS value associated with a sampling instant preceding the predefined number of samples.

The disturbance condition detection module 118 may detect whether a delta quantity is greater than a predefined threshold. In an example, the disturbance condition detection module 118 may continuously compare the delta with the predefined threshold to detect whether a delta quantity of the voltage has crossed the predefined threshold. In an example, the predefined threshold is about 0.5 Kilovolt. In response to determining that the delta quantity is greater than the predefined threshold, the IED 116 detects a peak delta quantity. The peak delta quantity represents a maximum value of the delta quantity. The disturbance condition detection module 118 then determines a time interval between a sampling instant associated with the peak delta quantity and a sampling instant associated with a first delta quantity, amongst the plurality of delta quantities. The disturbance condition detection module 118 compares the time interval with a threshold time to detect a disturbance condition. In response to detecting that the disturbance condition is a power swing, fault detection at the IED 116 may be blocked. Consequently, the IED 116 may be prevented from tripping during a power swing. Thus, by the detecting the power swings, an embodiment enables power swings to be distinguished from faults and may prevent misinterpretation of a power swing as a fault consequently preventing undesired tripping during power swings. These and other aspects are further described in conjunction with FIGS. 2-9B.

Figure 2:
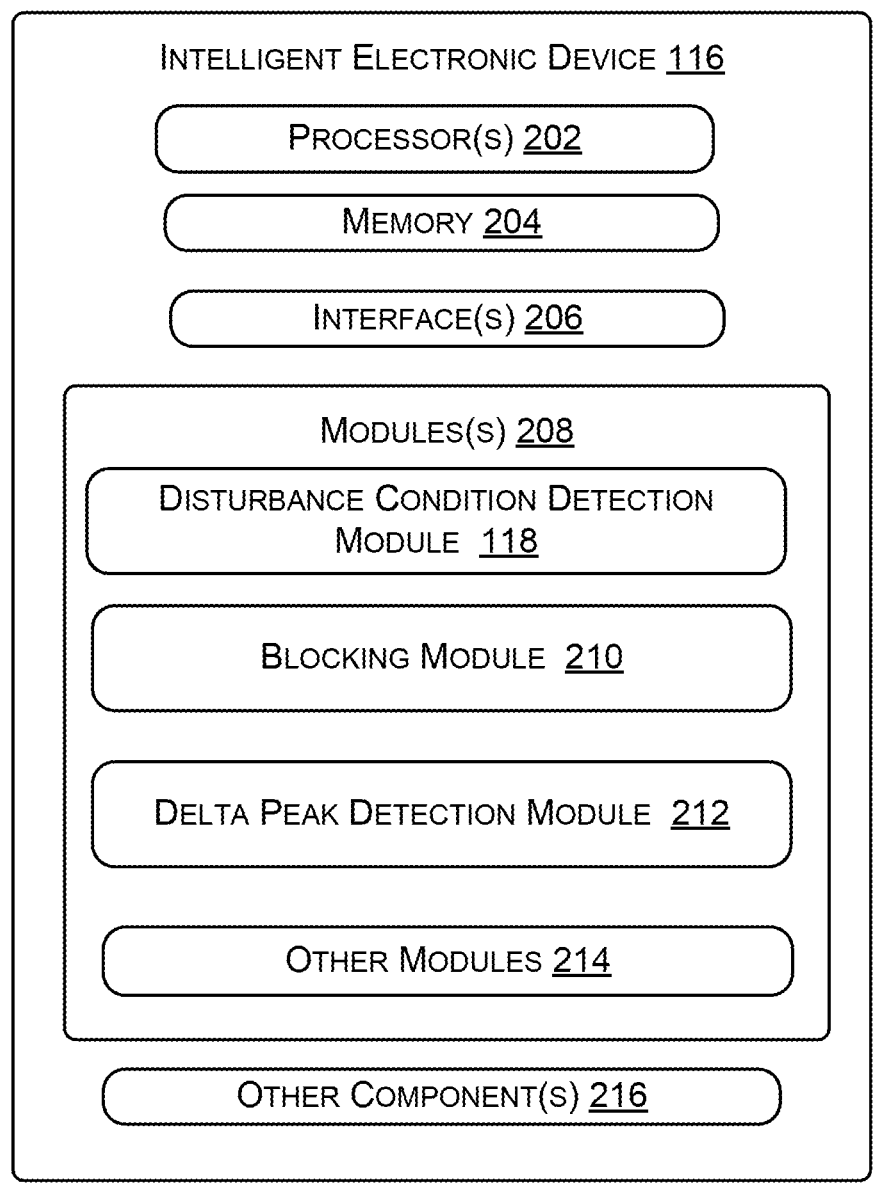
FIG. 2 illustrates a block diagram of an intelligent electronic device (IED), according to an example.

FIG. 2 illustrates a block diagram of an intelligent electronic device (IED) 116, in accordance with an example. The IED 116 includes processor(s) 202 and a memory 204. The processor(s) 202 may be a single processing unit or a number of units, all of which could include multiple computing units. The processor(s) 202 may be implemented as one or more microprocessor, microcomputers, digital signal processors, central processing units, state machines, logic circuitries, and/or any devices that manipulate signals based on operational instructions. Among other capabilities the processor(s) 202 are adapted to fetch and execute processor-readable instructions stored in the memory 204 to implement one or more functionalities.

The memory 204 may be coupled to the processor(s) 202. The memory 206 may include any computer-readable medium known in the art including, for example, volatile memory, such as Static Random-Access Memory (SRAM) and Dynamic Random-Access Memory (DRAM), and/or non-volatile memory, such as Read Only Memory (ROM), Erasable Programmable ROMs (EPROMs), flash memories, hard disks, optical disks, and magnetic tapes.

The IED 116 includes interface(s) 206. The interface(s) 206 may include a variety of software and hardware enabled interfaces. The interface(s) 206 may enable the communication and connectivity between the IED 116 and other components of an electrical network, such as the electrical network 100. Examples of such components include, but is not limited to, circuit breaker(s) 114 and sensors. The interface(s) 206 may facilitate multiple communications within a wide variety of protocols and may also enable communication with one or more computer enabled terminals or similar network components.

The IED 116 further includes module(s) 208. The module(s) 208 may be implemented as a combination of hardware and programming (for example, programmable instructions) to implement a variety of functionalities of the module(s) 208. In examples described herein, such combinations of hardware and programming may be implemented in several different ways. For example, the programming for the module(s) 208 may be executable instructions. Such instructions in turn may be stored on a non-transitory machine-readable storage medium which may be coupled either directly with the IED 116 or indirectly (for example, through networked means). In case implemented as a hardware, the module(s) 208 may include a processing resource (for example, either a single processor or a combination of multiple processors), to execute such instructions. In the present examples, the processor-readable storage medium may store instructions that, when executed by the processing resource, implement module(s) 208. In other examples, module(s) 208 may be implemented by electronic circuitry.

In an example, the module(s) 208 include the disturbance condition detection module(s) 118. In addition, the module(s) 208 may further include blocking module 210, delta peak detection module 212, and other module(s) 214. The other module(s) 214 may implement functionalities that supplement applications or functions performed by the IED 116 or any of the module(s) 208. In addition, the IED 116 may further include other component(s) 216. Such other component(s) 216 may include a variety of other electrical components that enable functionalities of managing and controlling the operation of the electrical network 100. Examples of such other component(s) 230 include, but is not limited to, relays, controllers, switches and voltage regulators.

In operation, the IED 116 may receive voltage measurements for each phase of a terminal of a power transmission line to which the IED 116 is connected from a PT in the transmission line. In an example, the voltage measurements may be received by the disturbance condition detection module 118. In an example, the IED 116 may sample the voltage measurements at a predefined sampling rate to obtain a plurality of samples. In an example, the sampling rate may range in the order of KHz to MHz. Each of the plurality of samples correspond to a sampling instant which is a time instant at which a sample is captured. Each of the plurality of samples represent values of phase voltage of a certain phase at a particular sampling instant. Thus, each of the plurality of samples may be represented as V(1), V(2), V(3), . . . , V(k) and so on, where "k" represents the sampling instant associated with the voltage. Although the present description is provided with reference to one phase, however, the same is applicable mutatis mutandis to all phases of the electrical network 100. In an example, in a three-phase power system, a power swing may be detected by executing the method explained hereinafter using voltage measurements for one phase. In another example, the power swing in a three-phase power system may be detected only upon detection of power swing in all the phases of the three-phase power system.

The disturbance condition detection module 118 determines a plurality of root mean square (RMS) values for each phase based on the voltage measurements of the corresponding phase. Each of the RMS values is associated with a respective sampling instant, amongst the plurality of sampling instants and is calculated using a predefined number of samples. The predefined number of samples based on which the RMS values are calculated may be referenced as "N". In an example, the predefined number of samples 'N' is the number of samples captured in one time period of the fundamental voltage/current cycle.

Consider that the disturbance condition detection module 118 calculates the RMS values based on, say, 20 samples. In an example, the predefined number of samples may be more than 20 or less than 20 depending on the configuration and hardware capabilities of the IED. Thus, the RMS value associated with the twentieth sampling instant may be calculated as shown in equation (1) below.

$$Vrms(20) = \sqrt{\frac{\{V(20)\}2 + \{V(19)\}2 + \{V(18)\}2 + \ldots + \{V(1)\}2}{20}} \quad (1)$$

In equation (1), V(20), V(19), V(18), . . . , and V(1) corresponds to the samples collected at the $20^{th}$, $19^{th}$, $18^{th}$, . . . , and $1^{st}$ sampling instants, respectively. Similarly, the RMS value associated with the fortieth sampling instant may be calculated as shown in equation (2).

$$Vrms(40) = \sqrt{\frac{\{V(40)\}2 + \{V(39)\}2 + \{V(38)\}2 + \ldots + \{V(21)\}2}{20}} \quad (2)$$

In equation (2), V(40), V(39), V(38), . . . , and V(21) corresponds to the samples collected at the $40^{th}$, $39^{th}$, $38^{th}$, . . . , and $21^{st}$ sampling instants, respectively.

Although, in the above example, the RMS values associated with the $20^{th}$ and $40^{th}$ sampling instant are shown to be calculated, in an example, the RMS values are calculated for each of the sampling instants in between $20^{th}$ and $40^{th}$ sampling instants and thereafter for each sampling instant. Thus, the RMS values are calculated using the predefined number of samples which include the sample captured at the respective sampling instant and samples captured at preceding sampling instants. Thus, the calculation of RMS value may be expressed as shown in equations (3) and (4) below.

$$V rms(k) = \sqrt{\{V(k)\}2 + \ldots + \{(k-N+1)\}2/N} \quad (3)$$

$$Vrms(k) = \sqrt{\sum_{i=k}^{k-N+1} V(l)2/N} \quad (4)$$

In equations (3) and (4), "k" represents the sampling instant associated with an RMS value and N represents the predefined number of samples using which the RMS value is calculated.

Figure 3:
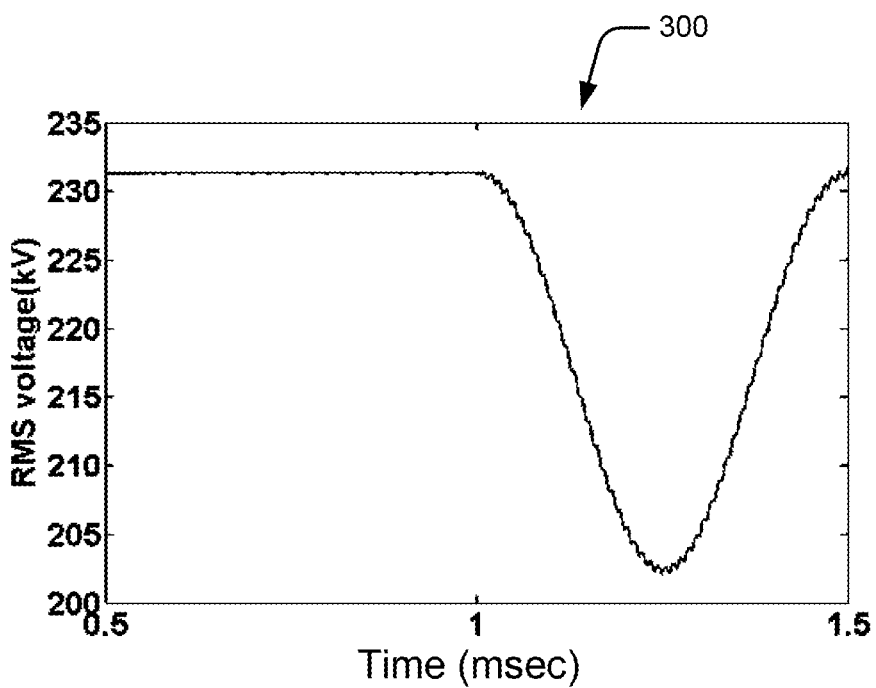
FIG. 3 illustrates a graph depicting RMS values of voltage associated with sampling instants plotted against time, according to an example.

FIG. 3 illustrates a graph 300 depicting RMS values of voltage associated with sampling instants plotted against time, according to an example. The Y-axis of the graph of FIG. 3 represents RMS values of voltage in Kilovolts (kV) associated with respective sampling time instants and the X-axis represents time in seconds. From FIG. 3, it may be noted that there is a sharp change in the RMS value between 1 second and 1.5 seconds.

Figure 4:
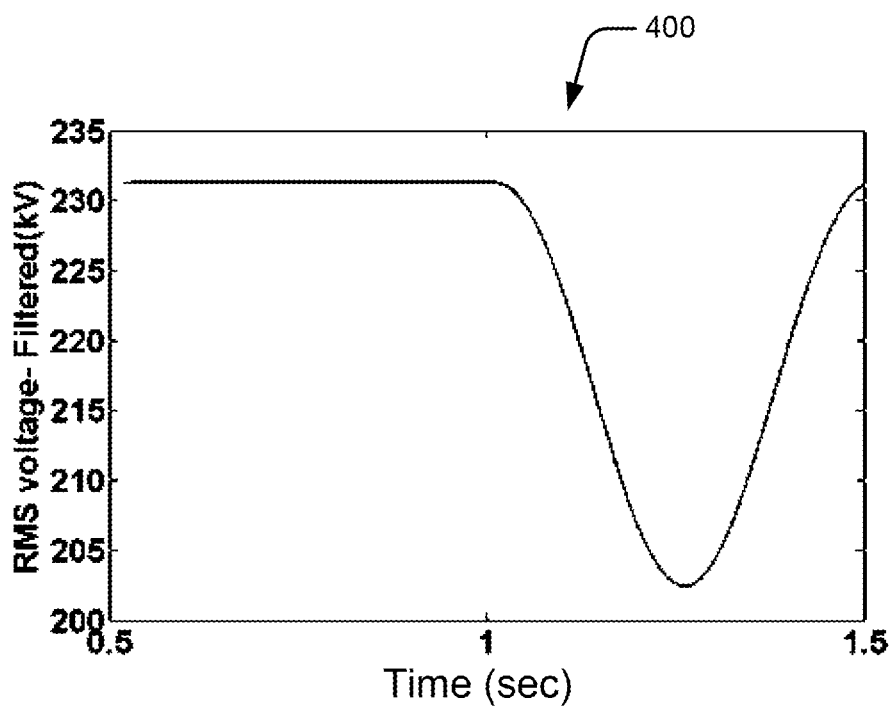
FIG. 4 illustrates the graph depicting RMS values of voltage associated with sampling instants plotted against time after filtering, according to an example.

In an example, after obtaining the RMS values, the disturbance condition detection module 118 may apply a moving average filter to the RMS values to reduce the ripple effects in the voltage. Thus, the disturbance condition detection module 118 may smoothen the obtained RMS values to remove effects of noise. A graph 400 depicting RMS values of voltage associated with sampling instants plotted against time after filtering, is illustrated in FIG. 4.

Once the RMS values are calculated, the disturbance condition detection module 118 determines a plurality of delta quantities for each phase. The delta quantities represent difference in voltages between two RMS values. Each of the plurality of delta quantities is associated with the respective sampling instant. The disturbance condition detection module 118 may calculate the delta quantities as follows. Consider that a delta quantity associated with the fortieth sampling instant is delta $V_{rms}(40)$, then, $$\text{delta } V_{rms}(40) = V_{rms}(40) - V_{rms}(20) \quad (5)$$

Similarly, a delta quantity associated with the forty first sampling instant is delta $V_{rms}(41)$ which is calculated as, $$\text{delta } V_{rms}(41) = V_{rms}(41) - V_{rms}(21) \quad (6)$$

Thus, the delta quantity can be expressed as, $$\text{delta } V_{rms}(k) = V_{rms}(k) - V_{rms}(k-N) \quad (7)$$

In equation (7), k is the sampling instant and N is the predefined number of samples using which the RMS value is calculated. Therefore, each of the delta quantities is calculated as a difference between an RMS value associated with the respective sampling instant and an RMS value associated with a sampling instant preceding the predefined number of samples.

Figure 5:
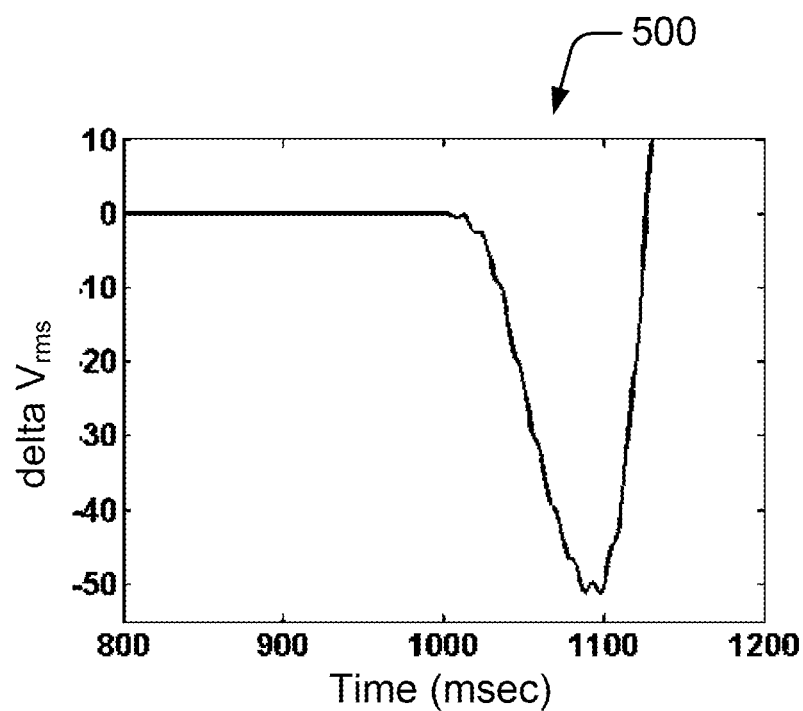
FIG. 5 illustrates a graph depicting delta quantities of voltages associated with the respective sampling instants plotted against time, according to an example.

FIG. 5 illustrates a graph 500 depicting delta quantities of voltages associated with the respective sampling instants plotted against time, according to an example. The Y-axis of the graph of FIG. 5 represents delta quantities of voltage (delta $V_{rms}$) in Kilovolts (kV) associated with respective sampling time instants and the X-axis represents time in milliseconds. From FIG. 5, it may be noted that difference between the RMS values of voltage has sharply increased between 1000 milliseconds and 1100 milliseconds.

Figure 6:
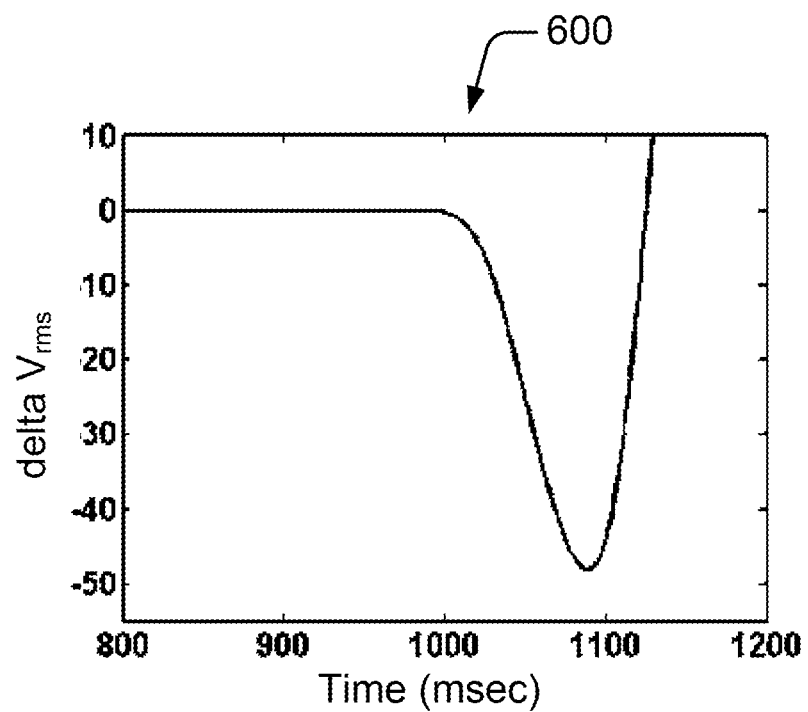
FIG. 6 illustrates the graph depicting delta quantities of voltages associated with the respective sampling instants plotted against time after filtering, according to an example.

In an example, after obtaining the delta quantities, the disturbance condition detection module 118 may apply a moving average filter to the delta quantities of the voltage to reduce the ripple effects in the voltage. Thus, the disturbance condition detection module 118 may smoothen the obtained delta quantities to remove effects of noise. A graph 600 depicting delta quantities of voltages associated with the respective sampling instants plotted against time after filtering, is illustrated in FIG. 6.

The disturbance condition detection module 118 then detects whether a delta quantity, amongst the plurality of delta quantities, is greater than a predefined threshold. In an example, the predefined threshold is set within the IED 116. The predefined threshold may be about 0.5 Kilovolt.

In response to determining that the delta quantity is greater than the predefined threshold, the disturbance condition detection module 118 may detect a peak delta quantity. The peak delta quantity corresponds to a maximum value of the delta quantity. In an example, the disturbance condition detection module 118 may initialize a delta peak detection module 212 to detect the peak delta quantity. The delta peak detection module 212 may determine a magnitude difference between two delta quantities, amongst the plurality of delta quantities, associated with two successive sampling instants, amongst the plurality of sampling instants. In an example, the delta peak detection module 212 may determine the magnitude difference between delta $V_{rms}(41)$ and delta $V_{rms}(40)$ as, $$X = |\text{delta } V_{rms}(41)| - |\text{delta } V_{rms}(40)| \quad (8)$$

In equation (8), the magnitude difference is represented as X.

The delta peak detection module 212 may identify a zero crossing of the magnitude difference. In an example, the delta peak detection module 212 may use a zero-crossing detector to identify the change in sign of the magnitude difference. When the value of X changes from positive to negative, then it may be identified that a peak of the delta quantity has occurred. Thus, the delta peak detection module 212 may determine the peak delta quantity based on the zero crossing of the magnitude difference. In an example, other maxima determination techniques may be used for determining the peak delta quantity.

Figure 7:
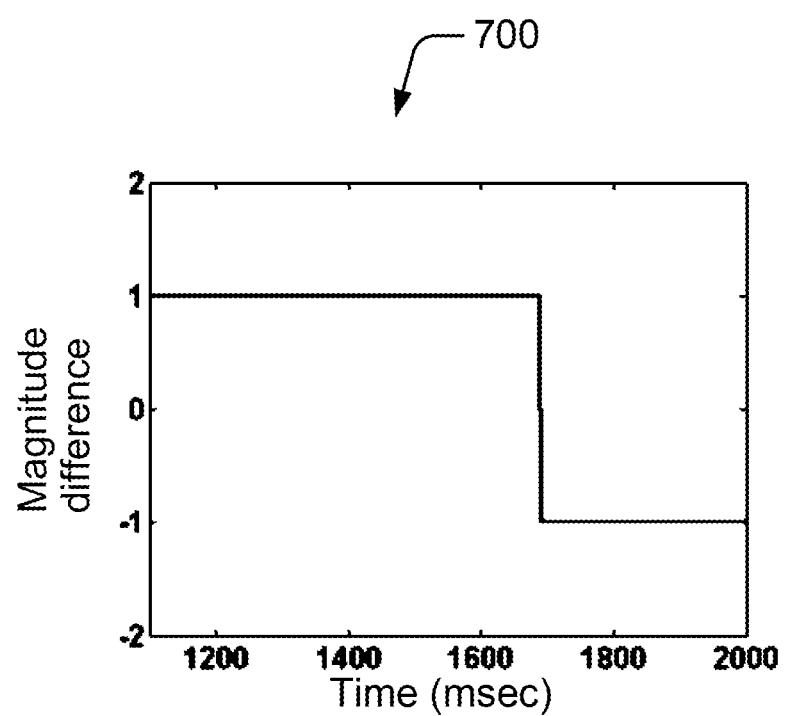
FIG. 7 illustrates a graph depicting the values of magnitude difference between two successive delta quantities plotted against time, according to an example.

FIG. 7 illustrates a graph obtained by plotting the values of magnitude difference between two successive delta quantities against time. The Y-axis of the graph of FIG. 7 represents the magnitude difference and the X-axis represents time in milliseconds. From FIG. 7, it may be noted that the magnitude difference between two delta quantities of voltage has changed from +ve to −ve between 1600 and 1800 milliseconds. Thus, a peak of the delta quantity may occur between 1600 and 1800 milliseconds.

Once the peak delta quantity is determined, the disturbance condition detection module 118 determines a time interval between a sampling instant associated with the peak delta quantity and a sampling instant associated with a first delta quantity, amongst the plurality of delta quantities. The time interval between the peak delta quantity and the first delta quantity is representative of the time taken by the delta quantity to reach the peak. In the above example, consider that the peak delta quantity is determined to be delta $V_{rms}(41)$. Thus, the disturbance condition detection module 118 determines a time interval between a sampling instant associated with delta $V_{rms}(41)$ and a sampling instant associated with delta $V_{rms}(40)$.

The time interval is compared with a threshold time. In an example, the threshold time ranges between 50 milliseconds to 55 milliseconds. If the time interval is greater than the threshold time, then occurrence of a power swing is identified. Thus, the disturbance condition detection module 118 may detect a disturbance condition based on a comparison of the time interval with the threshold time. In response to detecting that the disturbance condition is a power swing, a blocking module 210 may be initialized to block fault detection at the IED 116 or to prevent the IED 116 from sending trip commands to the circuit breakers 114. Thus, an embodiment enables detection of a power swing and blocking fault detection at the IED in response to the power swing being detected.

Figure 8:
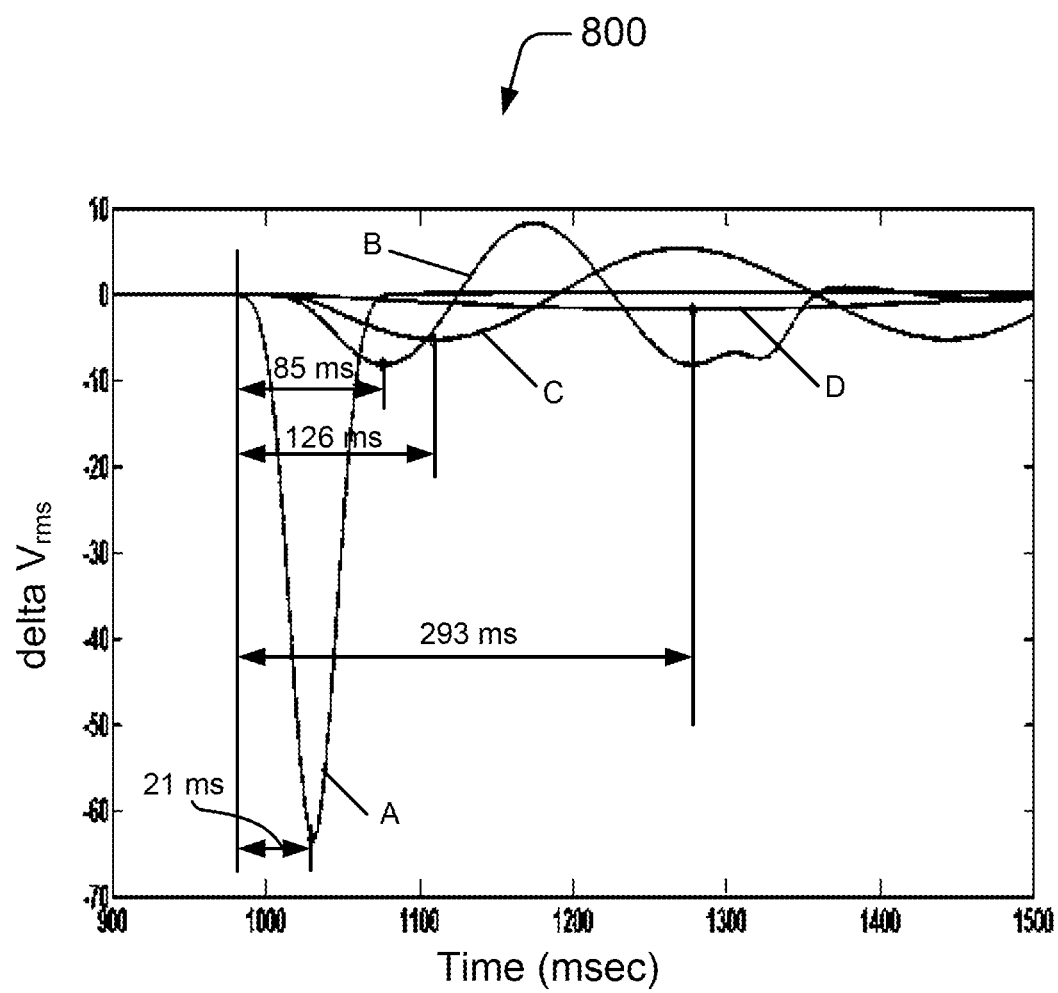
FIG. 8 illustrates a graph indicating time taken by a delta quantity to reach its peak value in different scenarios of electrical disturbances, according to an example.

FIG. 8 illustrates a graph 800 indicating time taken by the delta quantity to reach its peak value in different scenarios of electrical disturbances, according to an example. FIG. 8 is obtained from test results based on a simulation of a power system consisting of a 400 kV, 50 Hz double circuit transmission line of length 100 km. The graph at FIG. 8 illustrates delta voltages plotted against time for four test cases including a three-phase fault at 95% of the protected line with a 500 fault resistance, and three power swing cases with swing frequencies of 1 Hz, 3 Hz, and 5 Hz. In the example of FIG. 8, the signal is measured at bus 110, as shown in FIG. 1.

With reference to FIG. 8, the line referenced as A represents the curve of the delta quantities in case of a fault. The line referenced as B represents the curve of the delta quantities in case of a power swing with swing frequency 5 Hz. The line referenced as C represents the curve of the delta quantities in case of a power swing with swing frequency 3 Hz. The line referenced as D represents the curve of the delta quantities in case of a power swing with swing frequency 1 Hz. The time required for each of these curves to reach the peak point from the instant of fault or swing is marked in FIG. 8. It can be observed from this figure that the time required to reach to the peak point for three phase fault case is 21 millisecond (ms), whereas, for the power swing cases with swing frequencies of 1, 3 and 5 Hz the time interval is 293 ms, 126 ms, and 85 ms, respectively. Thus, in an embodiment, by monitoring the time interval between the peak delta quantity and the first delta quantity, power swings ranging from frequencies of about 0.1 Hz to 5 Hz may be reliably detected and fault detection at the IED 116 may be blocked accordingly.

Figure 9A:
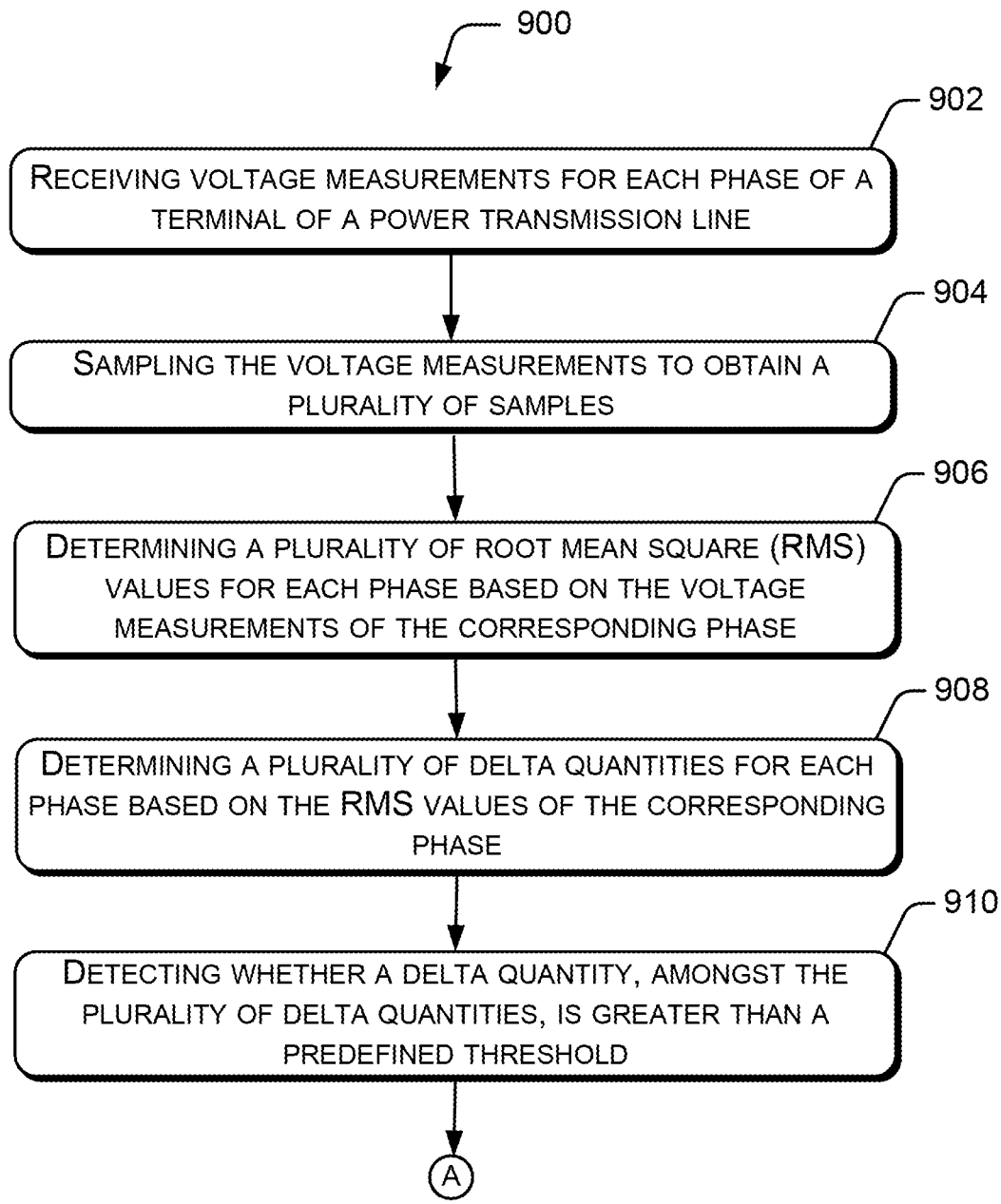
FIGS. 9A and 9B illustrate a method for operating an Intelligent Electronic Device (IED) during a power swing, according to an example.
Figure 9B:
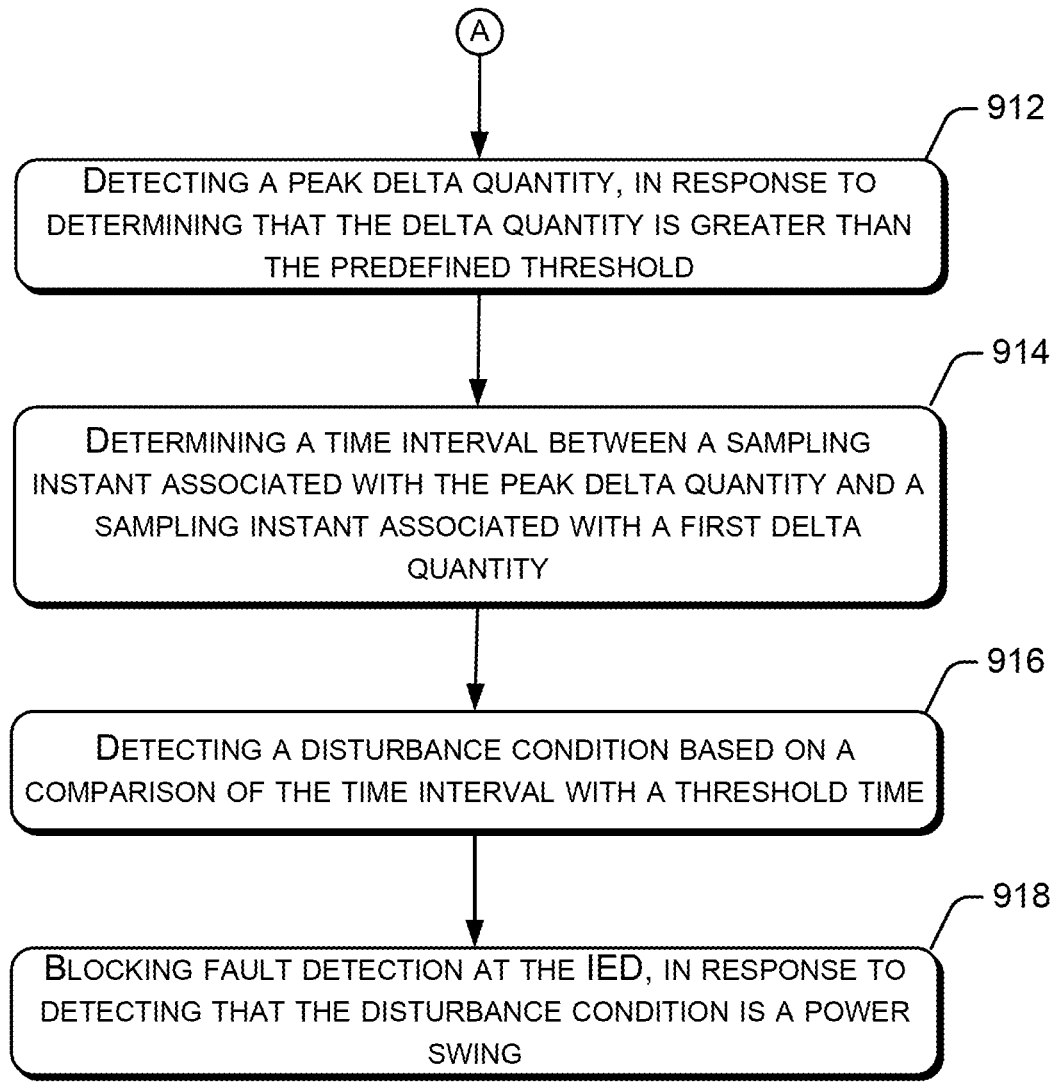

FIGS. 9A and 9B illustrate a method 900 for operating an Intelligent Electronic Device (IED) during a power swing, according to an example. The method 900 may be executed by a system, such as the IED 116. The method 900 can be implemented by processing resource(s) or electrical control systems through any suitable hardware, programmable instructions, or combination thereof. In an example, step(s) of the method 900 may be performed by hardware or programming modules, such as the disturbance condition detection module 118, delta peak detection module 212, and the blocking module 210. Further, although the method 900 is described in context of the aforementioned IED 116, other suitable systems may be used for execution of the method 900. It may be understood that processes involved in the method 900 can be executed based on instructions stored in a non-transitory computer-readable medium. The non-transitory computer-readable medium may include, for example, digital memories, magnetic storage media, such as a magnetic disks and magnetic tapes, hard drives, or optically readable digital data storage media.

Referring to FIG. 9A, at block 902, voltage measurements for each phase of a terminal of a power transmission line is received. In an example, the terminal may be a bus, such as the bus 110 of FIG. 1 and the power transmission line may be the power transmission line 114 shown in FIG. 1 to which an IED, such as the IED 116, is coupled. In an example, the voltage measurements are continuously received from a potential transformer (PT) in the transmission line.

In an example, in a three-phase power system, a power swing may be detected by executing the method explained hereinafter using voltage measurements for one phase. In another example, the power swing in a three-phase power system may be detected only upon detection of power swing in all the phases of the three-phase power system.

At block 904, the voltage measurements of each phase are sampled at a predefined sampling rate to obtain a plurality of samples. Each of the plurality of samples correspond to a sampling instant which is a time instant at which a sample is captured.

At block 906, a plurality of root mean square (RMS) values for each phase is determined based on the voltage measurements of the corresponding phase. Each of the plurality of RMS values is associated with a respective sampling instant, amongst the plurality of sampling instants, and is calculated using a predefined number of samples. The predefined number of samples include samples including the sample captured at the respective sampling instant and samples captured at preceding sampling instants.

At block 908, a plurality of delta quantities is determined for each phase based on the RMS values of the corresponding phase. Each of the plurality of delta quantities is associated with the respective sampling instant and is calculated as a difference between an RMS value associated with the respective sampling instant and an RMS value associated with a sampling instant preceding the predefined number of samples.

At block 910, it is detected whether a delta quantity, is greater than a predefined threshold. In an example, the plurality of delta quantities are continuously monitored and compared with the predefined threshold to detect if a delta quantity has crossed the predefined threshold. In an example, the predefined threshold is about 0.5 Kilovolt. The connection point A at the end of FIG. 9A signifies that the illustration of the figure is continued to the next drawing.

With reference to FIG. 9B, in response to determining that the delta quantity is greater than the predefined threshold, a peak delta quantity is detected at block 912. In an example, a magnitude difference between two delta quantities, amongst the plurality of delta quantities, associated with two successive sampling instants, amongst the plurality of sampling instants is determined. A zero crossing of the magnitude difference is identified. Based on the zero crossing of the magnitude difference, the peak delta quantity may be determined.

At block 914, a time interval between a sampling instant associated with the peak delta quantity and a sampling instant associated with a first delta quantity, amongst the plurality of delta quantities, is determined. In an example, the time interval is compared with a threshold time. In an example, the threshold time ranges between 50 milliseconds to 55 milliseconds.

At block 916, a disturbance condition is detected based on a comparison of the time interval with a threshold time. In response to determining that the time interval is greater than the threshold time, the disturbance condition is detected as a power swing. In response to detecting that the disturbance condition is a power swing, fault detection at the IED is blocked or the IED is prevented from sending signals to the circuit breakers for tripping the circuit, at block 918.

Although implementations of present disclosure have been described in language specific to structural features and/or methods, it is to be noted that the present disclosure is not necessarily limited to the specific features or methods described. Rather, the specific features and methods are disclosed and explained in the context of a few implementations for the present disclosure.

The invention claimed is:

1. A method for operating an Intelligent Electronic Device (IED) in a power swing condition, wherein the IED is associated with a terminal of a power transmission line, the method comprising:

receiving voltage measurements for each phase of the terminal of the power transmission line, wherein the voltage measurements are sampled to obtain a plurality of samples, each of the plurality of samples corresponding to a sampling instant which is a time instant at which a sample is captured;

determining a plurality of root mean square (RMS) values for the measurements in each phase based on the voltage measurements of the corresponding phase, wherein each of the plurality of RMS values is associated with a respective sampling instant, amongst the plurality of sampling instants, and is calculated using a predefined number of samples, the predefined number of samples including the sample captured at the respective sampling instant and samples captured at preceding sampling instants;

determining a plurality of delta quantities for each phase, wherein each of the plurality of delta quantities is associated with the respective sampling instant, and is calculated as a difference between an RMS value associated with the respective sampling instant and an RMS value associated with a sampling instant preceding the predefined number of samples;

detecting whether a delta quantity, amongst the plurality of delta quantities, is greater than a predefined threshold, based on continuous monitoring of the plurality of delta quantities;

detecting a peak delta quantity, in response to determining that the delta quantity is greater than the predefined threshold;

determining a time interval between a sampling instant associated with the peak delta quantity and a sampling instant associated with a first delta quantity, amongst the plurality of delta quantities;

detecting a disturbance condition based on a comparison of the time interval with a threshold time; and blocking fault detection at the IED, in response to detecting that the disturbance condition is a power swing.

2. The method as claimed in claim 1, wherein the disturbance condition is detected as a power swing, in response to determining that the time interval is greater than the threshold time.

3. The method as claimed in claim 1, wherein detecting the peak delta quantity comprises:

determining a magnitude difference between two delta quantities, amongst the plurality of delta quantities, associated with two successive sampling instants, amongst the plurality of sampling instants;

identifying a zero crossing of the magnitude difference; and determining the peak delta quantity based on the zero crossing of the magnitude difference.

4. The method as claimed in claim 1, wherein the predefined threshold is about 0.5 Kilovolt.

5. The method as claimed in claim 1, wherein the threshold time ranges between 50 milliseconds to 55 milliseconds.

6. An Intelligent Electronic Device (IED) operable in a power swing condition, wherein the IED is associated with a terminal of a power transmission line, the IED comprising:

a processor; and a disturbance condition detection module coupled to the processor to:

receive voltage measurements for each phase of the terminal of the power transmission line, wherein the voltage measurements are sampled to obtain a plurality of samples, each of the plurality of samples corresponding to a sampling instant which is a time instant at which a sample is captured;

determine a plurality of root mean square (RMS) values for each phase based on the voltage measurements of the corresponding phase, wherein each of the plurality of RMS values is associated with a respective sampling instant, amongst the plurality of sampling instants, and each of the plurality of RMS values is calculated using a predefined number of samples, the predefined number of samples including the sample captured at the respective sampling instant and samples captured at preceding sampling instants;

determine a plurality of delta quantities for each phase, wherein each of the plurality of delta quantities is associated with the respective sampling instant, and each of the plurality of delta quantities is a difference between an RMS value associated with the respective sampling instant and an RMS value associated with a sampling instant preceding the predefined number of samples;

detect whether a delta quantity, amongst the plurality of delta quantities, is greater than a predefined threshold, based on continuous monitoring of the plurality of delta quantities;

detect a peak delta quantity, in response to determining that the delta quantity is greater than the predefined threshold;

determine a time interval between a sampling instant associated with the peak delta quantity and a sampling instant associated with a first delta quantity, amongst the plurality of delta quantities; and detect a disturbance condition based on a comparison of the time interval with a threshold time; and a blocking module coupled to the processor to:

block fault detection at the IED, in response to detecting that the disturbance condition is a power swing.

7. The IED as claimed in claim 6, wherein the disturbance condition is detected as a power swing, in response to determining that the time interval is greater than the threshold time.

8. The IED as claimed in claim 6, further comprising a peak detection module to:

determine a magnitude difference between two delta quantities, amongst the plurality of delta quantities, associated with two successive sampling instants, amongst the plurality of sampling instants;

identify a zero crossing of the magnitude difference; and determine the peak delta quantity based on the zero crossing of the magnitude difference.

9. The IED as claimed in claim 6, wherein the predefined threshold is about 0.5 Kilovolt.

10. The IED as claimed in claim 6, wherein the threshold time ranges between 50 milliseconds to 55 milliseconds.

11. The IED as claimed in claim 6, wherein the predefined threshold is about 0.5 Kilovolt, and the threshold time ranges between 50 milliseconds to 55 milliseconds.

12. The IED as claimed in claim 8, wherein the disturbance condition is detected as a power swing, in response to determining that the time interval is greater than the threshold time.

13. The method as claimed in claim 3, wherein the disturbance condition is detected as a power swing, in response to determining that the time interval is greater than the threshold time.

14. The method as claimed in claim 3, wherein the predefined threshold is about 0.5 Kilovolt, and the threshold time ranges between 50 milliseconds to 55 milliseconds.

15. The method as claimed in claim 1, wherein the predefined threshold is about 0.5 Kilovolt, and the threshold time ranges between 50 milliseconds to 55 milliseconds.

16. A non-transitory machine-readable storage medium having instructions stored thereon, wherein the instructions, when executed by a processor, cause the processor to perform a method for operating an Intelligent Electronic Device (IED) in a power swing condition, wherein the IED is associated with a terminal of a power transmission line, the method comprising:

receiving voltage measurements for each phase of the terminal of the power transmission line, wherein the voltage measurements are sampled to obtain a plurality of samples, each of the plurality of samples corresponding to a sampling instant which is a time instant at which a sample is captured;

determining a plurality of root mean square (RMS) values for the measurements in each phase based on the voltage measurements of the corresponding phase, wherein each of the plurality of RMS values is associated with a respective sampling instant, amongst the plurality of sampling instants, and is calculated using a predefined number of samples, the predefined number of samples including the sample captured at the respective sampling instant and samples captured at preceding sampling instants;

determining a plurality of delta quantities for each phase, wherein each of the plurality of delta quantities is associated with the respective sampling instant, and is calculated as a difference between an RMS value associated with the respective sampling instant and an RMS value associated with a sampling instant preceding the predefined number of samples;

detecting whether a delta quantity, amongst the plurality of delta quantities, is greater than a predefined threshold, based on continuous monitoring of the plurality of delta quantities;

detecting a peak delta quantity, in response to determining that the delta quantity is greater than the predefined threshold;

determining a time interval between a sampling instant associated with the peak delta quantity and a sampling instant associated with a first delta quantity, amongst the plurality of delta quantities;

detecting a disturbance condition based on a comparison of the time interval with a threshold time; and blocking fault detection at the IED, in response to detecting that the disturbance condition is a power swing.

17. The non-transitory machine-readable medium as claimed in claim 16, wherein the disturbance condition is detected as a power swing, in response to determining that the time interval is greater than the threshold time.

18. The non-transitory machine-readable medium as claimed in claim 16, wherein detecting the peak delta quantity comprises:

determining a magnitude difference between two delta quantities, amongst the plurality of delta quantities, associated with two successive sampling instants, amongst the plurality of sampling instants;

identifying a zero crossing of the magnitude difference; and determining the peak delta quantity based on the zero crossing of the magnitude difference.

19. The non-transitory machine-readable medium as claimed in claim 16, wherein the predefined threshold is about 0.5 Kilovolt.

20. The non-transitory machine-readable medium as claimed in claim 16, wherein the threshold time ranges between 50 milliseconds to 55 milliseconds.

* * * * *